(12) United States Patent
Yoon et al.

(10) Patent No.: US 12,205,273 B2
(45) Date of Patent: Jan. 21, 2025

(54) ARTIFICIAL INTELLIGENCE VISION INSPECTION SYSTEM FOR WIRING HARNESS

(71) Applicant: KYUNGRIMTECH CO., LTD., Gyeongsan-si (KR)

(72) Inventors: Seak Dong Yoon, Ulsan (KR); Kyeong Dok Park, Seoul (KR)

(73) Assignee: KYUNGRIMTECH CO., LTD., Gyeongsan-si (KR)

(*) Notice: Subject to any disclaimer, the term of this patent is extended or adjusted under 35 U.S.C. 154(b) by 333 days.

(21) Appl. No.: 17/967,700

(22) Filed: Oct. 17, 2022

(65) Prior Publication Data

US 2023/0129522 A1 Apr. 27, 2023

(30) Foreign Application Priority Data

Oct. 27, 2021 (KR) ........................ 10-2021-0144322

(51) Int. Cl.

| | |
|---|---|
| *G06T 7/13* | (2017.01) |
| *G01R 31/00* | (2006.01) |
| *G01R 31/66* | (2020.01) |
| *G06T 7/00* | (2017.01) |
| *G06T 7/90* | (2017.01) |
| *G06V 10/25* | (2022.01) |
| *G06V 20/50* | (2022.01) |
| *H04N 23/56* | (2023.01) |
| *H04N 23/90* | (2023.01) |

(52) U.S. Cl.
CPC ............ *G06T 7/001* (2013.01); *G01R 31/006* (2013.01); *G01R 31/66* (2020.01); *G06T 7/13* (2017.01); *G06T 7/90* (2017.01); *G06V 10/25* (2022.01); *G06V 20/50* (2022.01); *H04N 23/56* (2023.01); *H04N 23/90* (2023.01); *G06T 2207/10024* (2013.01); *G06T 2207/20084* (2013.01); *G06T 2207/30108* (2013.01)

(58) Field of Classification Search
CPC .. G06T 7/001; G06T 7/13; G06T 7/90; G06T 2207/10024; G06T 2207/20084; G06T 2207/30108; G06T 7/0004; G01R 31/006; G01R 31/66; G01R 31/308; G06V 10/25; G06V 20/50; G06V 10/751; G06V 20/52; G06V 2201/06; G06V 10/82; H04N 23/56; H04N 23/90
USPC .......................................................... 382/141
See application file for complete search history.

(56) References Cited

U.S. PATENT DOCUMENTS

2002/0036512 A1* 3/2002 Maeda ................. G06T 7/0004
356/237.4

FOREIGN PATENT DOCUMENTS

| CN | 107505326 A | 12/2017 |
|---|---|---|
| JP | 2002-014133 A | 1/2002 |
| JP | 2016-223869 A | 12/2016 |
| KR | 10-0551299 B1 | 2/2006 |
| KR | 10-1645133 B1 | 8/2016 |
| KR | 10-1665644 B1 | 10/2016 |

(Continued)

*Primary Examiner* — Stephen P Coleman
(74) *Attorney, Agent, or Firm* — Bridgeway IP Law Group, PLLC; Sang Ho Lee; Hyun Woo Shin

(57) ABSTRACT

Provided is an artificial intelligence vision inspection system for a wiring harness, the system minimizing personnel expenses and maximizing inspection performance by automatically determining visual failure of a wiring harness in an artificial intelligence type that uses a deep learning model.

6 Claims, 6 Drawing Sheets

(56) References Cited

FOREIGN PATENT DOCUMENTS

KR 10-1884557 B1 8/2018

\* cited by examiner

ARTIFICIAL INTELLIGENCE VISION INSPECTION SYSTEM FOR WIRING HARNESS

CROSS-REFERENCE TO RELATED APPLICATION

This application claims priority to Korean Patent Application No. 10-2021-0144322, filed on Oct. 27, 2021, in the Korean Intellectual Property Office, the disclosure of which is incorporated herein by reference.

BACKGROUND OF THE INVENTION

Field of the Invention

The present disclosure relates to an artificial intelligence vision inspection system for a wiring harness and, in more detail, an artificial intelligence vision inspection system for a wiring harness, the system minimizing personnel expenses and maximizing inspection performance by automatically determining visual failure of a wiring harness in an artificial intelligence type that uses a deep learning model.

Description of the Related Art

As disclosed in Korean Patent No. 10-0551299, in general, a wiring harness, which is a device formed by fastening several cables in a bunch and coupling a connector to the end of the fastened bunch, is usually used for electric wirings of apparatuses, particularly, vehicles in which electric devices are concentrated. Since several cables constitute one module in such a wiring harness, when one of the cables is defective, it is difficult to find out and recover the defective cable. If a defective wiring harness is mounted in a vehicle, other assembled parts have to be separated, so there may be a problem that the manufacturing process is delayed and the work efficiency is deteriorated. Accordingly, since it is substantially impossible to recover a defective wiring harness after forwarding, pre-forwarding inspection for finding out defective wiring harnesses is severely performed.

However, there is a problem that since pre-forwarding inspection is manually performed by inspectors in the related art, not only the inspection time is long, but excessive personnel expenses are incurred, and since whether there is a defect is visually determined by inspectors, differences are generated in individual inspection ability of workers, and minute differences of parts are not detected and defective products are intactly forwarded in many cases due to limitation of inspection depending on determination of human.

SUMMARY OF THE INVENTION

The present disclosure has been made in an effort to solve the problems described above and an objective of the present disclosure is to provide an artificial intelligence vision inspection system for a wiring harness, the system being able to greatly reduce inspection time and personnel expenses because vision inspection for determining failure can be automatically performed by only placing a wiring harness on a bed plate, and being able to maximize inspection performance and prevent forwarding of defective products because it is possible to precisely sort normal products and defective products in an artificial intelligence type that uses a deep learning model.

In order to achieve the objectives, an artificial intelligence vision inspection system for a wiring harness according to the present disclosure, which is an artificial intelligence vision inspection system for a wiring harness that includes a cable tie fastening a plurality of cables in a cable bunch, a connector coupled to the end of the cable bunch, and a bolt time coupled to the circumstance of the cable bunch, includes: a bed plate horizontally disposed and providing a space on a top thereof in which a wiring harness can be placed; a top lamp disposed over the bed plate and providing downward light toward the placed wiring harness; a top camera disposed over the bed plate and creating harness inspection image data of the entire appearance of the placed wiring harness; and an inspector terminal including a deep learning program based on an artificial neural network of machine learning for object recognition and programmed and learned to inspect the appearance of the wiring harness on the basis of the harness inspection image data, and detecting visual failure of any one or more of the cable tie, the connector, and the bolt time using the deep learning model and outputting detected result data when the harness inspection image data created by the top camera are input.

The wiring harness further includes a label showing harness information of the wiring harness, and a taper wound around the cable bunch and keeping the cables fastened, and the inspector terminal may detect visual failure for inspection items including whether one or more of the cable tie, the connector, the bolt tie, the label, or the taper are omitted, fastened at correct positions, and have designated colors.

The bed plate may be a flat plate lamp that provides upward light toward a wiring harness placed on the top thereof.

The inspector terminal may recognize the cable tie, the connector, and the bolt tie as objects in the input harness inspection image data and may show part codes and recognition probability values of the recognized objects in the harness inspection image data.

The artificial intelligence vision inspection system further includes: a connector jig disposed on a side of the bed plate and holding a connector with an insertion hole thereof facing a side; side lamp providing lateral light toward the insertion hole of the connector held by the connector jig; and a side camera creating connector inspection image data including fastening pins in the insertion hole by photographing the insertion hole of the held connector, and the inspector terminal may include a deep learning model programmed and learned to inspect the appearance of the fastening pins on the basis of the connector inspection image data, and may detect visual failure of the fastening pins and outputs detected result data when the connector inspection image data created by the side camera is input.

The inspector terminal may extract a first ROI image having the connector as an interest region from the connector inspection image data input from the side camera, may extract an insertion hole outline by binarizing the extracted first ROI image, may create a minimum space quadrangle receiving the extracted insertion hole outline, and may create a second ROI image by deforming the inclined insertion hole outline into a quadrangle or a regular quadrangle by adjusting apexes of the minimum space quadrangle.

The inspector terminal may create a third ROI image by extracting only portions matched to a template image of a fastening pin stored in advance from the second ROI image on the basis of the template image.

The inspector terminal may compare a determination reference image, which is obtained from a wiring harness that is a normal product, with the third ROI image, may extract an inspection image in which only different portions indicated by a designated color, may detect an object by binarizing the extracted inspection image, and may obtain inspection result data by showing an image of the detected object in the second ROI image.

According to the artificial intelligence vision inspection system for a wiring harness of the present disclosure, first, a bed plate is horizontally disposed and provides an inspection space on the top thereof in which a wiring harness can be placed, a top lamp is disposed over the bed plate and providing downward light toward the placed wiring harness, a top camera disposed over the bed plate and creating harness inspection image data of the entire appearance of the placed wiring harness, and an inspector terminal includes a deep learning program based on an artificial neural network of machine learning for object recognition and programmed and learned to inspect the appearance of the wiring harness on the basis of the harness inspection image data, and detects visual failure of any one or more of the cable tie, the connector, and the bolt time using the deep learning model and outputs detected result data when the harness inspection image data created by the top camera are input, whereby vision inspection for determining failure can be automatically performed when an inspector only places a wiring harness on the bed plate. Accordingly, it is possible to significantly reduce inspection time and personnel expenses. Further, since it is possible to precisely sort normal products and defective products in an artificial intelligence type using a deep learning model, it is possible to maximize inspection performance and thus prevent forwarding of a defective product.

Second, the inspector terminal can precisely determine failure of a wiring harness separately for each part by detecting visual failure for inspection items including whether one or more of the cable tie, the connector, and the bolt tie are omitted, fastened at correct positions, and have designated colors.

Third, the wiring harness further includes a label showing harness information of the wiring harness, and a taper wound around the cable bunch and keeping the cables fastened, and the inspector terminal detects visual failure for inspection items including whether one or more of the cable tie, the connector, the bolt tie, the label, or the taper are omitted, fastened at correct positions, and have designated colors, whereby it is possible to determine failure of a wiring harness separately for the parts.

Fourth, the bed plate is a flat plate lamp that provides upward light toward a wiring harness placed on the top thereof, whereby it is possible to prevent en error in object recognition due to a shade of the wiring harness placed on the bed plate by downward light of the top lamp and it is possible to irradiate a placed wiring harness right under the wiring harness.

Fifth, the inspector terminal recognizes the cable tie, the connector, and the bolt tie as objects in the input harness inspection image data and shows part codes and recognition probability values of the recognized objects in the harness inspection image data so that an inspector can intuitively recognize the recognition state of the objects.

Sixth, the connector jig is disposed on a side of the bed plate and holds a connector that is an inspection target with the insertion hole thereof faces a side, the slide lamp provides lateral light toward the insertion hole of the connector held by the connector jig, the side camera creates connector inspection image data including the fastening pin in the insertion hole by photographing the insertion hole of the held connector, and The inspector terminal includes a deep learning model programmed and learned to inspect the appearance of the fastening pins on the basis of the connector inspection image data, and detects visual failure of the fastening pins and outputs detected result data when the connector inspection image data created by the side camera is input. Accordingly, there is an advantage that it is possible to obtain image data including fastening pins that are difficult to be obtained through the top camera and it is possible to intensively inspect the fastening pin portion of a connector that has a high failure ratio.

Seventh, the inspector terminal extracts a first ROI image having the connector as an interest region from the connector inspection image data input from the side camera, extracts an insertion hole outline by binarizing the extracted first ROI image, creates a minimum space quadrangle receiving the extracted insertion hole outline, and creates a second ROI image by deforming the inclined insertion hole outline into a quadrangle or a regular quadrangle by adjusting apexes of the minimum space quadrangle. Accordingly, even though wiring harnesses are placed in different shapes, that is, amorphous shapes on the bed plate and are photographed with the insertion holes inclined, it is possible to secure image data of the insertion holes in a uniform type by correcting this problem.

Eighth, the inspector terminal creates a third ROI image by extracting only portions matched to a template image of a fastening pin stored in advance from a second ROI image on the basis of the template image, whereby it is possible to minimize analysis load by minimizing an analysis region for image analysis, so it is possible to maximize inspection performance by making inspection regions the same even though the scales of second ROI images are different.

Ninth, the inspector terminal compares a determination reference image, which is obtained from a wiring harness that is a normal product, with a third ROI image, extracts an inspection image in which only different portions indicated by a designated color, detects an object by binarizing the extracted inspection image, and obtain inspection result data by showing an image of the detected object in a second ROI image, whereby it is possible to intuitively recognize omission or defective such as bent, folded, and deformed portions of a fastening pin.

BRIEF DESCRIPTION OF THE DRAWINGS

The above and other objectives, features and other advantages of the present invention will be more clearly understood from the following detailed description when taken in conjunction with the accompanying drawings, in which.

DETAILED DESCRIPTION OF THE INVENTION

Hereinafter, preferred embodiments of the present disclosure will be described with reference to accompanying drawings. The terms and words used in the present specification and claims should not be interpreted as being limited to typical meanings or dictionary definitions, but should be interpreted as having meanings and concepts relevant to the technical scope of the present disclosure based on the rule according to which an inventor can appropriately define the concept of the term to describe most appropriately the best method he or she knows for carrying out the invention.

Therefore, the configurations described in the embodiments and drawings of the present disclosure are merely most preferable embodiments but do not represent all of the technical spirit of the present invention. Thus, it should be understood that the present disclosure should be construed as including all the changes, equivalents, and substitutions included in the spirit and scope of the present disclosure at the time of filing this application.

Figure 1:
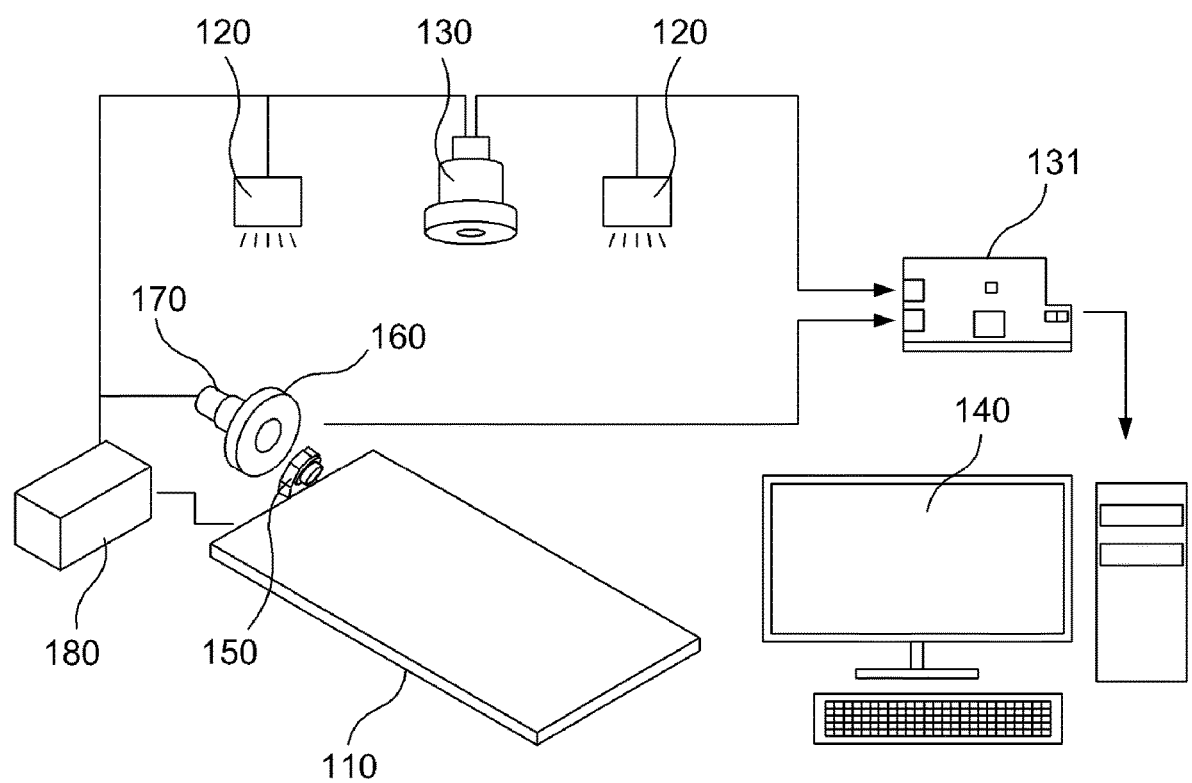
FIG. 1 is a schematic view showing the configuration of an artificial intelligence vision inspection system for a wiring harness according to a preferred embodiment of the present disclosure.
Figure 2:
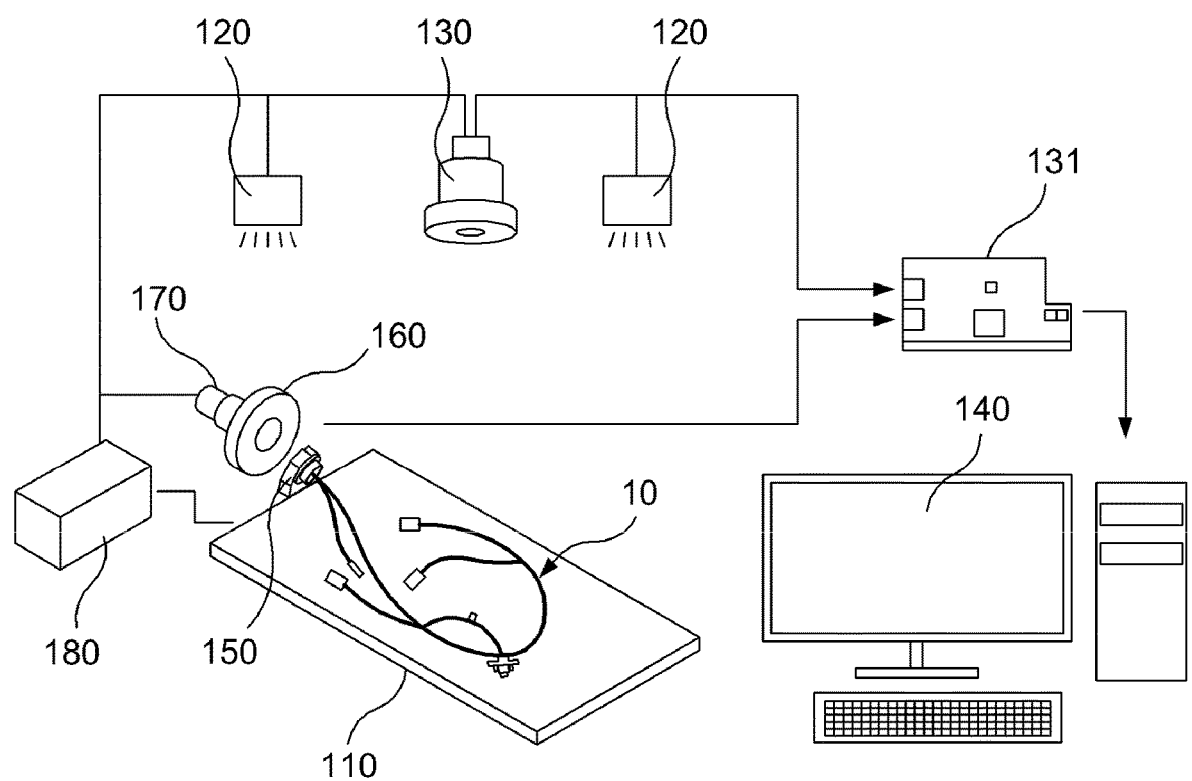
FIG. 2 is a picture showing an installation state of the artificial intelligence vision inspection system for a wiring harness according to a preferred embodiment of the present disclosure.

An artificial intelligence vision inspection system for a wiring harness according to a preferred embodiment of the present disclosure is an inspection system for inspecting the appearance of a wiring harness 10 that includes a cable tie fastening a plurality of cables in a cable bunch, a connector coupled to the end of the cable bunch, and a bolt time coupled to the circumstance of the cable bunch. As shown in FIGS. 1 and 2, the inspection system includes a bed plate 110, a top lamp 120, a top camera 130, and an inspector terminal 140. The cable tie and the bolt tie are both components for fastening a plurality of cables, but the bolt tie can be fixed or attached using a bolt disposed on a side at a specific portion in a vehicle after fastening a plurality of cables.

First, the bed plate 110 is horizontally disposed and provides a space on the top thereof in which a wiring harness 10 that is an inspection target can be placed. It is preferable that the bed plate has an area in which a wiring harness 10 having a maximum size can be unfolded and placed so that wiring harnesses 10 having various sizes can be inspected. Though not shown, the bed plate 110 may have a fixing unit for maintaining a placed wiring harness 10 in an unfolded state.

The bed plate 110 may be a flat plate lamp that provides upward light toward a wiring harness 10 placed on the top thereof, whereby it is possible to prevent en error in object recognition due to a shade formed under the wiring harness 10 placed on the bed plate 110 by downward light of the top lamp 120 and it is possible to irradiate a placed wiring harness 10 right under the wiring harness 10.

It is preferable that a horizontal plate on which a wiring harness 10 is placed on the bed plate 110 is made of a light transmissive material so that upward light emitted from a light source therein can irradiate the bottom of a wiring harness 10.

Figure 3:
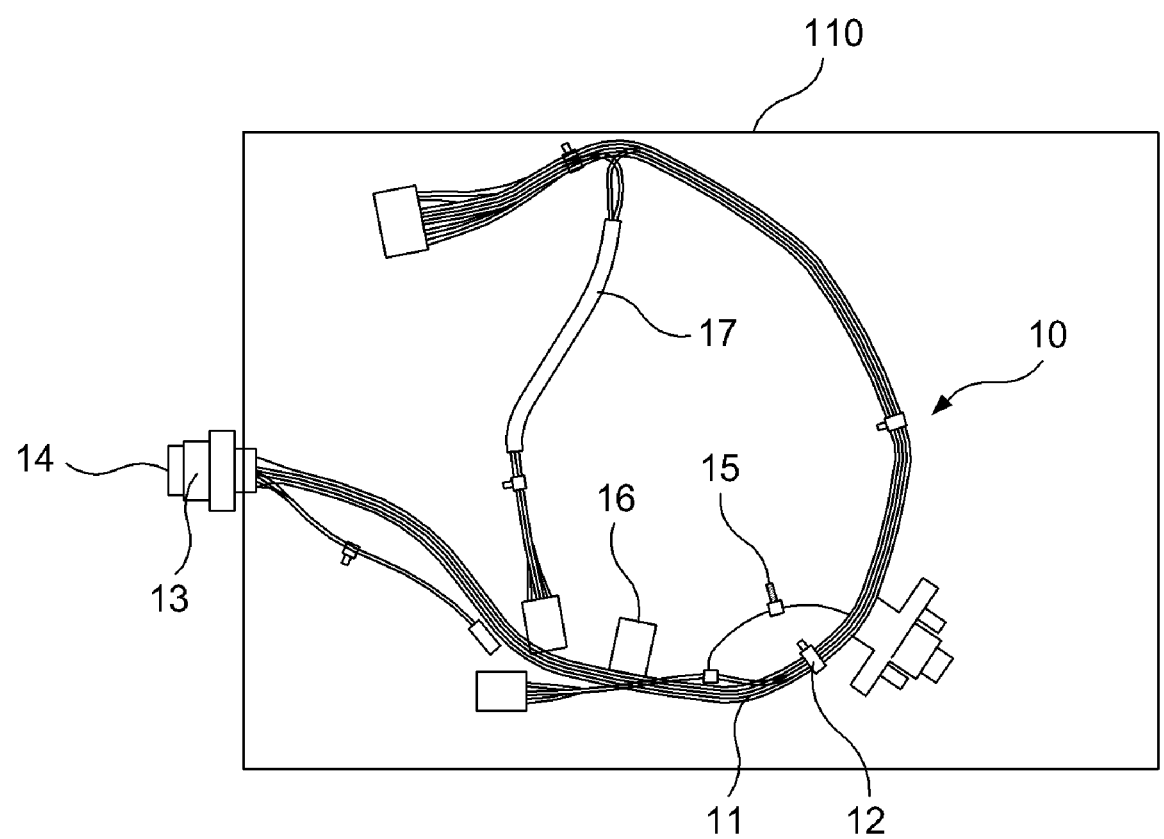
FIG. 3 is a view showing image data for harness inspection taken by top camera according to a preferred embodiment of the present disclosure.

The top lamp 120 is disposed over the bed plate 110 and provides downward light toward a placed wiring harness 10, and the top camera 130, which is a device for taking a plan picture of a wiring harness 10, is disposed over the bed plate 110, and as shown in FIG. 3, creates harness inspection image data D1 of the entire appearance of a placed wiring harness 110 while taking a picture.

In this configuration, as shown in FIG. 2, two top lamps 120 are spaced apart from each other and the top camera 130 is disposed between the top lamps 120, whereby photographing can be performed under entirely uniform brightness. Image data obtained by the top camera 130 is transmitted to the inspector terminal 140 for image analysis, and as shown in the figures, an image board 131 such as a frame grabber is disposed between the top camera 130 and the inspector terminal 140, whereby an analog signal that is transmitted from the top camera 130 is digitalized into bits defined for a sample and then transmitted to the inspector terminal 140.

The top lamp 120 and the top camera 130 can be electrically connected to a power supply module 180, which is supplied with external power (commercial power) and converts and supplies the external power into driving power, and can be driven by the supplied driving power. The power supply module 180 may simultaneously supply the driving power to a side lamp 160 and a side camera 170 to be described below besides the top lamp 120 and the top camera 130.

The inspector terminal 140, which is a device that inspects the appearance of a wiring harness 10 placed on the bed plate 110 by performing image analysis on harness inspection image data D1 obtained by the top camera 130, includes a deep learning program based on an artificial neural network of machine learning for object recognition and programmed and learned to inspect the appearance of a wiring harness 10 on the basis of the harness inspection image data D1, and detects visual failure of any one or more of the cable tie 12, the connector 13, and the bolt time 15 using the deep learning model and outputs the detected result data when the harness inspection image data D1 created by the top camera 130 are input.

The inspector terminal 140 can determine failure of a wiring harness 10 separately for each part by detecting visual failure for inspection items including whether the cable tie 12 and the bolt tie 15 are omitted, fastened at correct positions, and have designated colors.

The wiring harness 10 may further include a label 16 showing harness information of the wiring harness 10, and a taper 17 wound around the cable bunch 11 and keeping the cables fastened (the taper is taped by a common tape and keeps cables fastened). Accordingly, the inspector terminal 140 can precisely detect visual failure separately for each part for inspection items including whether one or more of the cable tie 12, the connector 14, the bolt tie 15, the label 16, or the taper 17 are omitted, fastened at correct positions, and have designated colors. Various inspection items such as whether the shape has been changed or the size is correct may be added, depending on the size or the kind of a wiring harness 10.

The inspector terminal 140 recognizes the cable tie 12, the connector 13, and the bolt tie 15 as objects in the input harness inspection image data D1 and shows part codes and recognition probability values of the recognized objects in the harness inspection image data D1 so that an inspector can intuitively recognize the recognition state of the objects.

The deep learning technology that is a kind of machine learning and is applied herein performs learning including an input layer, a hidden layer, and an output layer on the basis of data. The layers each includes a plurality of nodes and are connected to next layers, and the nodes between the layers may be connected to each other while having a weight.

The inspector terminal 140 forms a feature map by finding out a predetermined pattern from the input data, that is, image data of a wiring harness that is a normal product. The inspector terminal 140 can recognize an object and output the result by extracting a low level feature, a medium level feature, and a high level feature. The later the order of layers, the more the artificial neural network can abstract the layers into high levels features.

The nodes may be operated on the basis of an activation model and an output value corresponding to an input value may be determined in accordance with the activation model. A node, for example, the output value of a low level feature may be connected to may be input to the node of the next layer connected to the corresponding node, for example, the node of a medium level feature. The node of the next layer, for example, the node of the medium level feature can receive values output from a plurality of nodes of a low level feature. In this case, the input value of each node may be a value obtained by applying a weight to the output value of the node of a previous node. The weight may mean connection intensity between nodes. A multiple neural network extracts and sequentially abstracting feature information corresponding to each level using a layer learned in correspondence to each level, thereby being able to recognize a predetermined object using the feature information of the highest level.

Meanwhile, the inspector terminal 140 may use Deteron2 model to inspect components 11, 12, 13, and 15 as objects in image data. Deteron2 model is a Pytorch-based next-generation software system of Facebook Artificial Intelligence Research (FAIR) that implements a state-of-the-art object sensing algorithm. Deteron2 model is rewritten on the basis of Deteron1 model that is a previous version, and was derived from Maskrcnn-benchmark. Detectron2 includes the algorithms of DensePose and Mask R-CNN model developed by Facebook AI Research (FAIR). Detectron2 model, in a broad meaning, performs Object Detection, Semantic Segmentation, Instance Segmentation, Panoptic Segmentation, and Keypoint Detection.

Object Detection is a technology of detecting an object in an image, Semantic Segmentation is a technology of classifying objects in the same classes into the same regions or colors after Object Segmentation, Instance Segmentation is a technology of separating even the same classes (labels) into different instances after Object Segmentation, Panoptic Segmentation is a technology of combining inherent work of Semantic Segmentation (assigning a class label to each pixel) and Instance Segmentation (sensing and separating object instances), and Keypoint Detection is a technology of simultaneously sensing a person and a Keypoint element. Progress using Instance Segmentation of Detectron2 is exemplified in the present disclosure.

The inspector terminal 140 may use Mask R-CNN model to inspect components 11, 12, 13, and 15 as objects in image data.

Mask R-CNN is a model proposed to increase accuracy in work of Instance segmentation as a concept expanding from Faster R-CNN. Instance segmentation simultaneously performs Object Detection that find out an object and a position in an image and Semantic Segmentation that classifies all pixels for designated categories. Mask R-CNN is a model developed on the basis of Faster R-CNN and has two differences.

The first difference between Mask R-CNN and Fast/er R-CNN is to estimate Binary Mask for each RoI by adding Mask Branch, which estimate whether each pixel is a target object, to Box Branch in parallel. Mask Branch is composed of small Fully Convolutional Networks (FNC) and performs estimation in the unit of pixel.

The second difference between Mask R-CNN and Fast/er R-CNN is that since the existing type is a model for Object Detection and uses an RoI Pooling type because it is not important to take accurate position information, but RolAlign is used for Feature Extraction of each Region of Interest (RoI) to supplement the RoI Pooling type. It means a step of reducing only a portion corresponding to a Region of Interest (RoI) from a Feature Map to a low dimension vector through Max-pooling.

Max-pooling is a method of cutting an Activation Map into the size of M*N and then extracting the largest value from the Activation Map. Since such RoIPool performs pooling after rounding off the value of each coordinate, it damages adjacent pixel space information and position information of an original image is distorted, which greatly influences performance in Segmentation.

In an ROI and a Feature Map, when the ROI dost not accurately fit to a matrix cell blank of the Feature Map, that is, does not fit to a blank and is set as a point between a cell and a cell, it is possible to solve the position problem using Bilinear Interpolation. It is possible to find out what the region of a specific position accurately shows by finding out a target region through RolAlign.

Bilinear interpolation is a method of calculating a pixel value in a real number coordinate system using four adjacent pixel values in an original.

An AP is an index that is used to find out the performance of an algorithm through Average Precision, and the performance of RolAlign is considerably higher than that of RoIPool.

Meanwhile, the inspector terminal 10 can use VGG Image Annotator (VIA) as an Annotation tool. VGG Image Annotator is simple annotation software for an image, an audio, and a video. VIA is executed on a web browser and does not require installing or setting. Entire VIA software is provided in an HTML page of which the size is less than 400 KB.

Since vision inspection for determining failure can be automatically performed through the configuration described above that is a combination of the bed plate 110, the top lamp 120, the top camera 130, and the inspector terminal 140 when an inspector only places a wiring harness 10 on the bed plate 110, it is possible to significantly reduce inspection time and personnel expenses. Further, since it is possible to precisely sort normal products and defective products in an artificial intelligence type using a deep learning model, it is possible to maximize inspection performance and thus prevent forwarding of a defective product.

Meanwhile, the artificial intelligence vision inspection system for a wiring harness according to a preferred embodiment of the present disclosure can perform vision inspection, which is limitative to perform using connector inspection image data D2, such as whether a fastening pin has been omitted or bent (bent or deformed), on connectors 13, in which fastening pins frequently fail, of connectors 13 included in wiring harnesses 10. To this end, as shown in FIG. 4, the system may further include a connector jig 150, a side lamp 160, and a side camera 170.

The connector jig 150 is disposed on a side of the bed plate 110 and holds a connector 13 that is an inspection target with the insertion hole 14 thereof facing a side, the side lamp 160 provides lateral light toward the insertion hole 14 of the connector 13 held by the connector jig 150, and the side camera 170, which is a device that obtains an image for detecting bending (inclining/bending of about +3 degrees~−3 degrees) of fastening pins in the connector 13, creates connector inspection image data D2 including the fastening pins in the insertion hole 14 by photographing the insertion hole 14 of the held connector 13.

Figure 4:
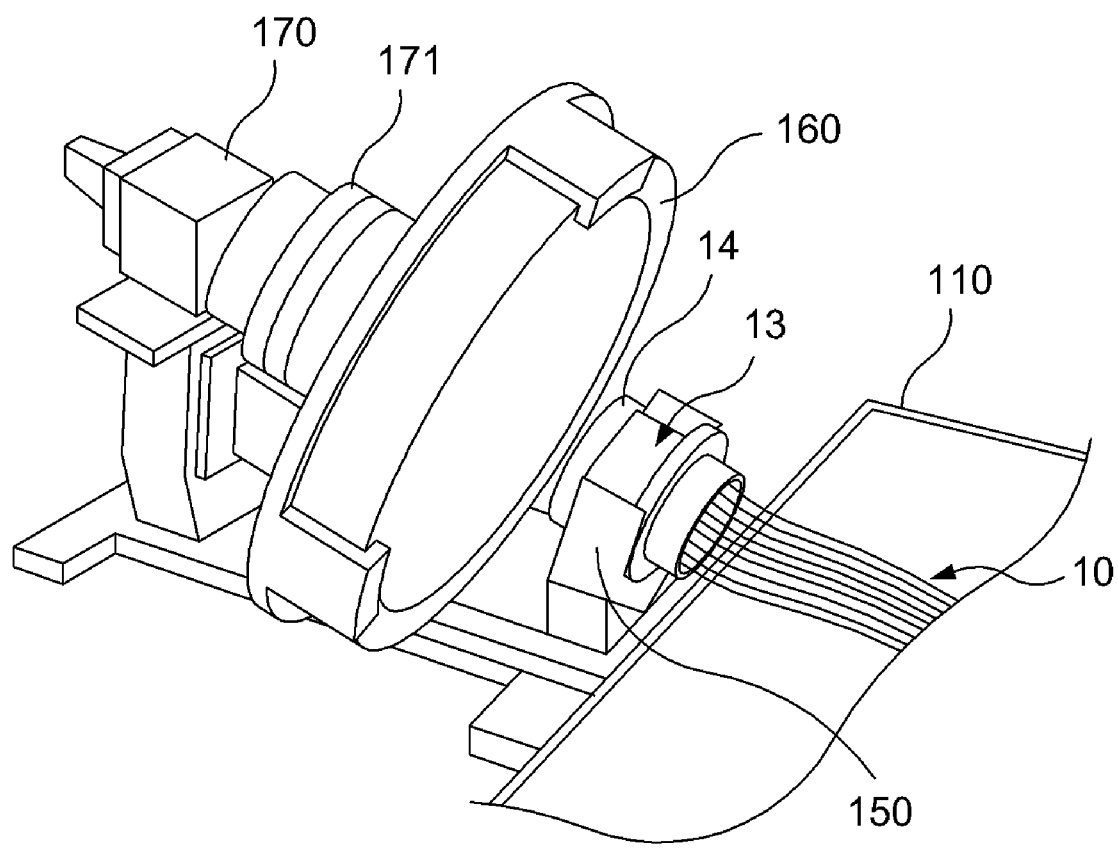
FIG. 4 is a picture showing a configuration for intensively inspecting a connector portion of a wiring harness using a side lamp and a side camera according to a preferred embodiment of the present disclosure.

The side lamp 140, as in FIG. 4, is formed in a ring shape having an open hole at a position laterally facing the connector 13 fixed at the connector jig 150 and a lens 171 of the side camera 170 is disposed in the hole, whereby it is possible to photograph the connector 13 from the front and provide entirely uniform light toward the insertion hole 14 of the connector 13.

The inspector terminal 140 includes a deep learning model programmed and learned to inspect the appearance of the insertion hole 14 on the basis of the connector inspection image data D2, and detects visual failure of the insertion hole 14 and outputs detected result data when the connector inspection image data D2 created by the side camera 17 is input.

Accordingly, there is an advantage that it is possible to obtain image data of the insertion hole 14 that are difficult to be obtained through the top camera 130 and it is possible to intensively inspect the fastening pin portion of a connector 13 that has a high failure ratio.

Figure 5:
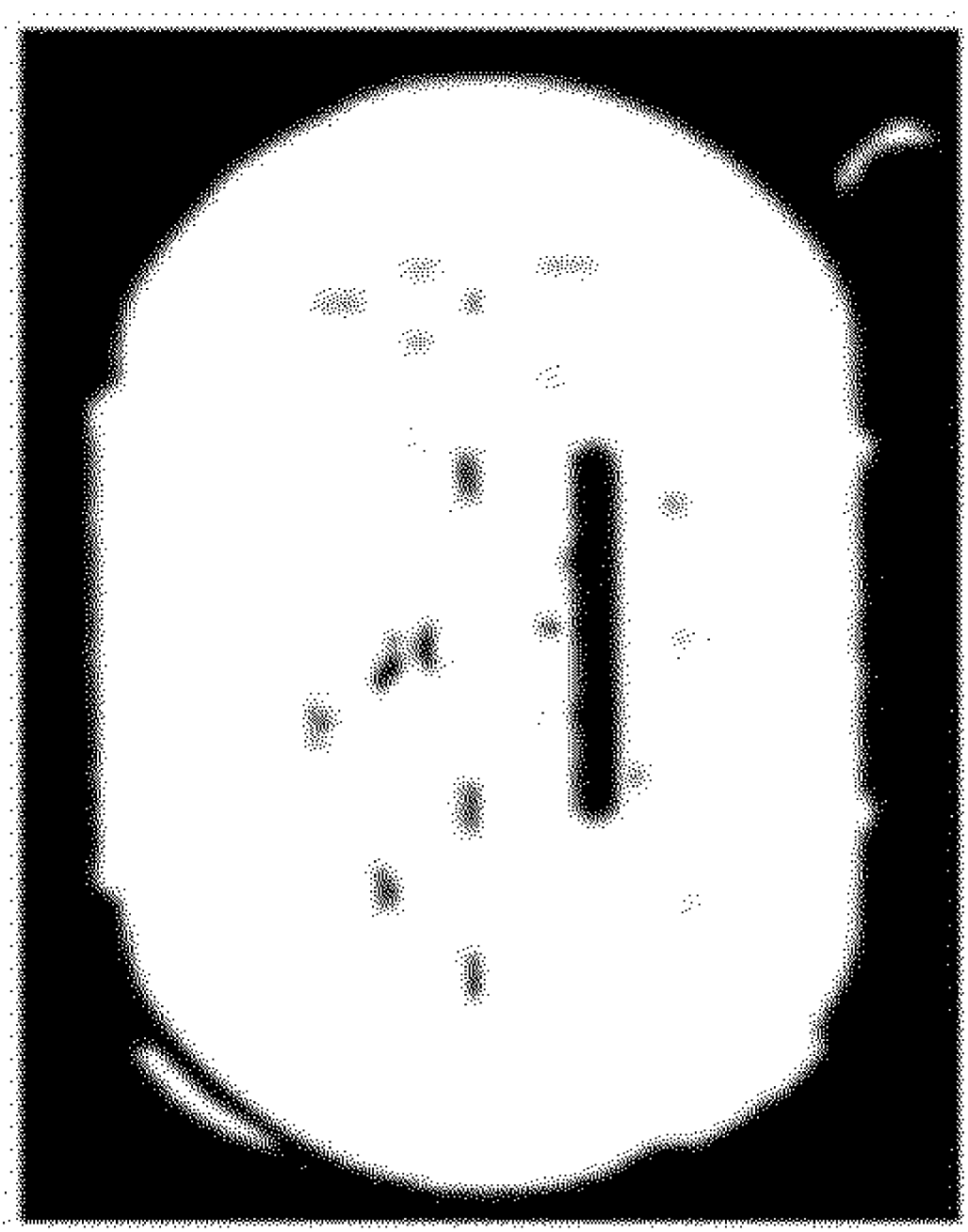
FIG. 5 is a view showing the state in which a first ROI image according to a preferred embodiment of the present disclosure has been binarized.
Figure 6:
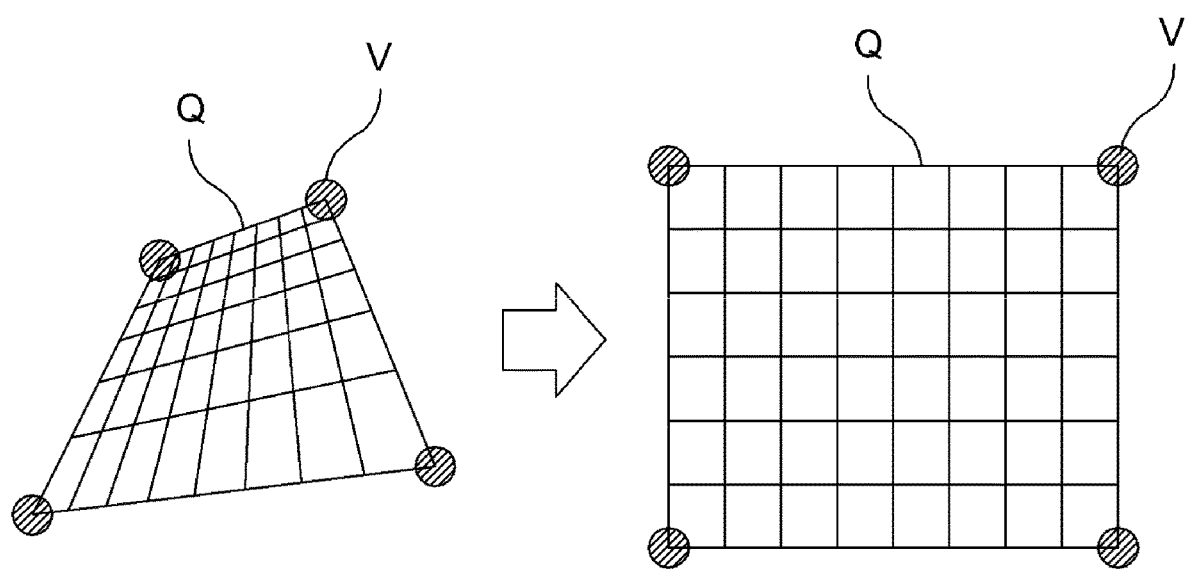
FIG. 6 is a view showing an operation principle of forming a minimum space quadrangle according to a preferred embodiment of the present disclosure.

The inspector terminal 140 extracts a first ROI image I1 having a connector as an interest region from the connector inspection image data D2 input from the side camera 170, extracts an insertion hole outline by binarizing the extracted first ROI image I1, as shown in FIG. 5, creates a minimum space quadrangle Q receiving the extracted insertion hole outline, and, as shown in FIG. 6, creates a second ROI image I2 in which inclination is corrected into a quadrangle or a regular quadrangle by deforming the inclined insertion hole outline into a quadrangle or a regular quadrangle by adjusting the apexes V of the minimum space quadrangle Q.

Accordingly, even though wiring harnesses 10 are placed in different shapes, that is, amorphous shapes on the bed plate 110 and are photographed with the insertion holes 14 inclined, it is possible to secure image data of the insertion holes 14 in a uniform type by correcting this problem. It is possible to more precisely detect the outline of a connector 13 through the process of binarizing the first ROI image I1.

The inspector terminal 140 creates a third ROI image I3 by extracting only portions matched to a template image of a fastening pin stored in advance from a second ROI image I2 on the basis of the template image, so even though the scales of second ROI images I2 are different, the shapes and sizes of inspection regions are made the same, whereby it is possible to maximize inspection performance. Unnecessary calculation load is reduced by a first ROI image I1 and a third ROI image I3, so it is possible to greatly reduce image analysis time. The third ROI image I3 may be set as a region including all fastening pins in the insertion hole 14 or may be set to be limited to a region including only some fastening pins, which frequently fail, of all fastening pins.

The inspector terminal 140 compares a determination reference image, which is obtained from a wiring harness 10 that is a normal product, with a third ROI image I3, extracts an inspection image in which only different portions indicated by a designated color, detects an object by binarizing the extracted inspection image, and obtains inspection result data by showing an image of the detected object in a second ROI image I2, whereby it is possible to intuitively recognize omission or defective such as bent, folded, or deformed portions of a fastening pin.

Although the present disclosure was described with reference to limited exemplary embodiments and drawings, the present disclosure is not limited thereto and may be changed and modified in various ways within the spirit of the present disclosure and claims described below by those skilled in the art.

What is claimed is:

1. An artificial intelligence vision inspection system for inspecting appearance of a wiring harness that includes a cable tie fastening a plurality of cables in a cable bunch, a connector coupled to an end of the cable bunch, and a bolt time coupled to a circumstance of the cable bunch, the artificial intelligence vision inspection system comprising:
a bed plate horizontally disposed and providing a space on a top thereof in which a wiring harness can be placed;
a top lamp disposed over the bed plate and providing downward light toward the placed wiring harness;
a top camera disposed over the bed plate and creating harness inspection image data of the entire appearance of the placed wiring harness; and
an inspector terminal including a deep learning program based on an artificial neural network of machine learning for object recognition and programmed and learned to inspect the appearance of the wiring harness on the basis of the harness inspection image data, and detecting visual failure of any one or more of the cable tie, the connector, and the bolt time using the deep learning model and outputting detected result data when the harness inspection image data created by the top camera are input,
and further comprising:
a connector jig disposed on a side of the bed plate and holding a connector with an insertion hole thereof facing a side;
a side lamp providing lateral light toward the insertion hole of the connector held by the connector jig; and
a side camera creating connector inspection image data including fastening pins in the insertion hole by photographing the insertion hole of the held connector,
wherein the inspector terminal includes a deep learning model programmed and learned to inspect the appearance of the fastening pins on the basis of the connector inspection image data, and detects visual failure of the fastening pins and outputs detected result data when the connector inspection image data created by the side camera is input, and
the inspector terminal extracts a first ROI image having the connector as an interest region from the connector inspection image data input from the side camera, and extracts an insertion hole outline by binarizing the extracted first ROI image, creates a minimum space quadrangle receiving the extracted insertion hole outline, and creates a second ROI image by deforming the inclined insertion hole outline into a quadrangle or a regular quadrangle by adjusting apexes of the minimum space quadrangle.

2. The artificial intelligence vision inspection system of claim 1, wherein a label showing harness information of the wiring harness, and a taper wound around the cable bunch and keeping the cables fastened, and
the inspector terminal detects visual failure separately for inspection items including whether one or more of the cable tie, the connector, the bolt tie, the label, or the taper are omitted, fastened at correct positions, and have designated colors.

3. The artificial intelligence vision inspection system of claim 1, wherein the bed plate is a flat plate lamp that provides upward light toward a wiring harness placed on the top thereof.

4. The artificial intelligence vision inspection system of claim 1, wherein the inspector terminal recognizes the cable tie, the connector, and the bolt tie as objects in the input harness inspection image data and shows part codes and recognition probability values of the recognized objects in the harness inspection image data.

5. The artificial intelligence vision inspection system of claim 1, wherein the inspector terminal creates a third ROI image by extracting only portions matched to a template image of a fastening pin stored in advance from the second ROI image on the basis of the template image.

6. The artificial intelligence vision inspection system of claim 5, wherein the inspector terminal compares a determination reference image, which is obtained from a wiring harness that is a normal product, with the third ROI image, extracts an inspection image in which only different portions indicated by a designated color, detects an object by binarizing the extracted inspection image, and obtains inspection result data by showing an image of the detected object in the second ROI image.

* * * * *